(12) United States Patent
Fukunaga

(10) Patent No.: US 6,517,370 B2
(45) Date of Patent: Feb. 11, 2003

(54) SOCKET FOR AN ELECTRIC DEVICE WITH A MOVABLE PLATE THAT IS ACTUATED BASED ON FORCE APPLIED TO AN ACTUATION MEMBER

(75) Inventor: Masami Fukunaga, Kawaguchi (JP)

(73) Assignee: Enplas Corporation (JP)

( * ) Notice: Subject to any disclaimer, the term of this patent is extended or adjusted under 35 U.S.C. 154(b) by 0 days.

(21) Appl. No.: 09/967,520

(22) Filed: Sep. 28, 2001

(65) Prior Publication Data
US 2002/0009915 A1 Jan. 24, 2002

Related U.S. Application Data

(63) Continuation of application No. 09/732,493, filed on Dec. 6, 2000, now abandoned, which is a continuation of application No. 08/943,547, filed on Oct. 3, 1997, now abandoned.

(51) Int. Cl.[7] .............................................. H01R 13/62
(52) U.S. Cl. ........................ 439/331; 439/330; 439/259
(58) Field of Search ................................. 439/331, 330, 439/264, 266, 70, 71, 259

(56) References Cited

U.S. PATENT DOCUMENTS

| 5,002,499 A | * | 3/1991 | Matsuoka | 439/259 |
|---|---|---|---|---|
| 5,192,221 A | * | 3/1993 | Matsuoka et al. | 439/259 |
| 5,443,591 A | * | 8/1995 | Tsai | 439/342 |
| 5,489,217 A | * | 2/1996 | Scheitz et al. | 439/266 |
| 5,588,861 A | * | 12/1996 | Townsend | 439/259 |
| 5,597,318 A | * | 1/1997 | Townsend | 439/259 |
| 5,707,247 A | * | 1/1998 | Konstad | 439/342 |
| 5,800,194 A | * | 9/1998 | Yamagishi | 439/264 |
| 5,807,127 A | * | 9/1998 | Ohshima | 439/266 |
| 5,865,639 A | * | 2/1999 | Fuchigami et al. | 361/709 |

* cited by examiner

Primary Examiner—Brian Sircus
Assistant Examiner—Michael C. Zarroli
(74) Attorney, Agent, or Firm—Fish & Richardson P.C.

(57) ABSTRACT

An IC socket which has a moving plate provided so that it can laterally move with respect to a base member, an operation member vertically moveably provided with respect to the base member, and at least one actuation member for moving contact pins arranged on the base member from a contact position to a non-contact position with respect to terminals of an IC package by laterally moving the moving plate in accordance with the depression of the operation member. The actuation member is arranged along the end surface of the moving plate.

11 Claims, 10 Drawing Sheets

SOCKET FOR AN ELECTRIC DEVICE WITH A MOVABLE PLATE THAT IS ACTUATED BASED ON FORCE APPLIED TO AN ACTUATION MEMBER

CROSS-REFERENCE TO RELATED APPLICATIONS

This application is a continuation under 35 U.S.C. §120 from U.S. application Ser. No. 09/732,493, filed Dec. 6, 2000 now abandoned, and application Ser. No. 08/943,547, filed Oct. 3, 1997 now abandoned.

BACKGROUND OF THE INVENTION

1. Field of the Invention

The present invention relates to an electric device socket provided with a large number of contact pins for electrical connection with a large number of pin-shaped or spherical-shaped terminals arranged in the form of a matrix on the bottom surface of an electric device such as an integrated circuit (IC) package, more particularly relates to an improvement of an open top type socket which causes the contact pins to move between a contact position and a non-contact position with respect to terminals of the electric device by lateral movement of a moving plate with respect to a base member.

2. Description of the Related Art

Japanese Unexamined Patent Publication (Kokai) No. 4-19979 discloses an open top type socket configured so as to cause contact pins having a spring property to move between a contact position and non-contact position with respect to terminals of an IC package by lateral movement of a moving plate. This type of conventional socket is provided with a base member on which a large number of contact pins are arranged in the form of matrix corresponding to the arrangement of the terminals of the IC package, a moving plate provided on this base member so that lateral movement is possible, and an operation lever serving as an actuation member for laterally moving this moving plate. A large number of through holes through which terminals of the IC package and contact pins are passed are arranged in the form of a matrix on the moving plate. The operation lever exhibits a gate shape. The two leg portions of the operation lever are attached to the two ends of a support shaft extending passing between the two side surfaces of end portions of the base member and, at the same time, connected to the two ends of a transmission shaft extending passing between the two side surfaces of the end portions of the moving plate. Further, an upper end portion of the operation lever is located above the other end portions of the base member and moving plate. In this type of socket, when the upper end portion of the operation lever is depressed by an operation member provided so as to be vertically moveable with respect to the base member, the operation lever laterally moves the moving plate via the transmission shaft by the lever principle, therefore the contact pins can be moved from the contact position to the non-contact position with respect to the terminals of the IC package against a spring force thereof.

In the above conventional IC use socket, it is necessary to secure the operation stroke of the operation lever for laterally moving the moving plate a predetermined amount or more, therefore the leg portions of the operation lever must be arranged at the outside of the two side surfaces of the moving plate. For this reason, it is difficult to secure enough strength of the operation lever, so the operation of the operation lever is apt to become unstable. Further, the depression force of the operation member act concentratedly upon the two ends of the transmission shaft passing through the end portions of the moving plate via the two leg portions of the operation lever, therefore it is difficult to smoothly operate the moving plate.

On the other hand, in the IC use socket disclosed in Japanese Unexamined Patent Publication (Kokai) No. 57-41280, the lateral movement plate for moving the contact pins arranged in the form of a matrix between the contact position and non-contact position with respect to the terminals of the IC package is divided into a plurality of sliding plates.

This type of divided sliding plate has end portions formed as knife edges and pushes and makes a pressing sliding member run along a guide groove so as to sequentially move the sliding plate and switch on/off the contact pins.

In the above conventional IC use socket, since the lateral movement plate is divided into a plurality of sliding plates, the on/off switching operation of the contact pins can be easily carried out, but the pressing sliding member must be attached or detached in a lateral direction and the amount of actuation of the pressing sliding member is large, so there are the problems that the operability is poor and application to automatic machines is difficult. Further, the necessity of performing the on/off switching operation of the contact pins by two different end portions becomes a cause lowering the operability by automatic machines.

SUMMARY OF THE INVENTION

Accordingly, an object of the present invention is to provide an socket for an electric device capable of stably operating a moving plate for moving contact pins from a contact position to a non-contact position with respect to terminals of an electric device to be mounted and actuation members for laterally moving the moving plate and, in addition, excellent in operability.

To attain the above object, the present invention provides an electric device socket characterized in that provision is made of a base member on which a large number of contact pins for contact with terminals of an electric device are arranged in the form of a matrix, a moving plate provided laterally moveably with respect to the base member and engaged with the contact pins, an operation member provided vertically moveably with respect to the base member, and at least one actuation member engaged with an end portion of the moving plate and receiving an actuation force of the operation member so as to act so as to laterally move the moving plate at the time of depression of the operation member, the actuation member being arranged along the end surface of the moving plate.

In the electric device socket having the above configuration, since the actuation member engaged with the end portion of the moving plate is arranged along the end surface of the moving plate, the actuation force of the operation member can be dispersed along the end surface of the moving plate via the actuation member when made to act upon the end portion of the moving plate. Accordingly, the moving plate can be smoothly laterally moved by the actuation force dispersed along the end surface thereof. Further, the actuation member can be arranged effectively utilizing a lateral width in a direction orthogonal to the direction of lateral movement in the end portion of the moving plate, therefore concentration of stress to the actuation member can be prevented and the operational stability and durability of the actuation member can be easily enhanced. In addition, the actuation member can be operated by the vertical movement of the operation member with respect to the base member, therefore the operability is excellent and application to an automatic machine becomes easy.

Preferably, the actuation member is engaged with an end portion of the moving plate via a transmission shaft passing through the end portion of the moving plate in a direction orthogonal to the direction of lateral movement.

According to the above configuration, the actuation force dispersed by an actuation member can be made to act upon the moving plate via the transmission shaft. Further, since a transmission shaft passing through the end portion of the moving plate in a direction orthogonal to the direction of lateral movement is used, the engagement structure between the actuation member and the moving plate can be simplified and the assembly work can be facilitated.

Preferably, the transmission shaft is divided into a plurality of sections in a direction orthogonal to the direction of lateral movement of the moving plate.

According to the above configuration, since the transmission shaft is divided into a plurality of sections, permanent strain of the shaft etc. can be prevented in comparison with the case where the transmission shaft is constituted by a single piece over the entire length and the service life of the transmission shaft can be prolonged. Further, a latch member for engaging with another actuation member, for example, the mounted electric device, can be arranged in the space between shaft sections, therefore the socket configuration can be effectively utilized.

Preferably, actuation members are engaged with opposite end portions of the moving plate, respectively, so as to perform a pressing or pulling action in the direction of lateral movement of the moving plate.

According to the above configuration, the actuation force of the operation member can be made to act upon the two end portions of the moving plate via the actuation member performing a pressing action upon one end portion of the moving plate and the actuation member performing the pulling action with respect to the other end portion of the moving plate, therefore the moving plate can be further smoothly laterally moved along the opposite end surfaces thereof by respectively dispersed actuation forces.

Preferably, each actuation member comprises a single actuation plate, and the actuation plate has three or more engagement portions engaged with the end portions of the moving plate.

According to the above configuration, the actuation force of the operation member can be made to act upon the end portions of the moving plate by reliably dispersing it by the three or more engagement portions of the actuation plates.

Preferably, each actuation member has a plurality of actuation plates which are connected to each other and constitute a toggle mechanism.

According to the above configuration, a large actuation force for laterally moving the moving plate can be obtained from the actuation force given from the operation member to the actuation members, therefore the operation member can be operated by a light force.

Preferably, each actuation member comprises a plurality of independent units arranged along an end portion of the moving plate, and the units can individually actuate so as to laterally move the moving plate when receiving the actuation force of the operation member.

According to the above configuration, the actuation force of the operation member can be dispersed by a plurality of units and made to individually act upon the end portion of the moving plate. Further, the units can individually actuate, therefore even if a variation occurs in timing etc. of receiving the actuation force from the operation member, the variation can be absorbed in an initial stage by the individual actuation of units. Accordingly, thereafter, a uniform actuation force can be made to act upon the moving plate.

Preferably, each unit comprises a single actuation plate.

According to the above configuration, the actuation force of the operation member is reliably dispersed wide along the end surfaces of the moving plate by the actuation plates of the units and can be made to act upon the end portions of the moving plate.

Preferably, each unit has a plurality of actuation plates which are connected to each other and constitute a toggle mechanism.

According to the above configuration, a large actuation force for laterally moving the moving plate can be obtained from the actuation force given from the operation member to the actuation plates of the units, therefore the operation member can be actuated by a light force.

Preferably, the moving plate comprises a plurality of plate pieces arranged in a direction orthogonal to the direction of lateral movement thereof.

According to the above configuration, by changing the combination of the number of plate pieces, electric device socket having different numbers of contact pins can be easily manufactured.

DESCRIPTION OF THE PREFERRED EMBODIMENTS

Figure 1:
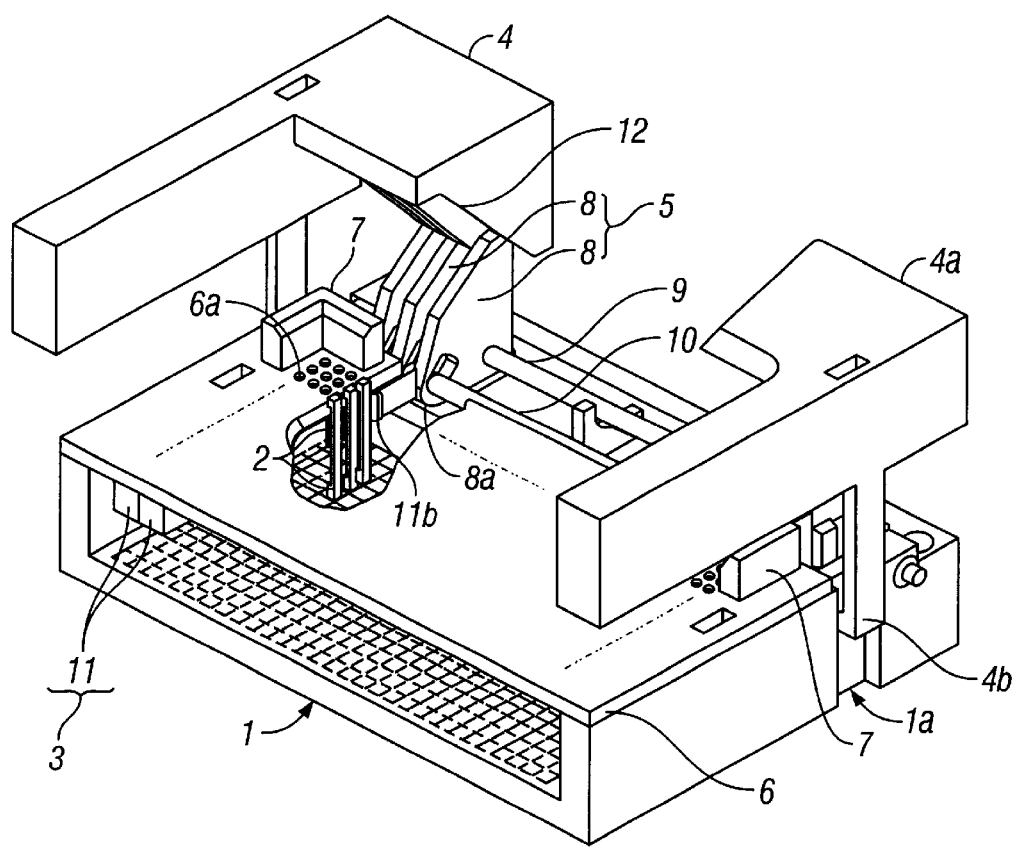
FIG. 1 is a partially sectional perspective view of an electric device socket showing a first embodiment of the present invention.
Figure 2:
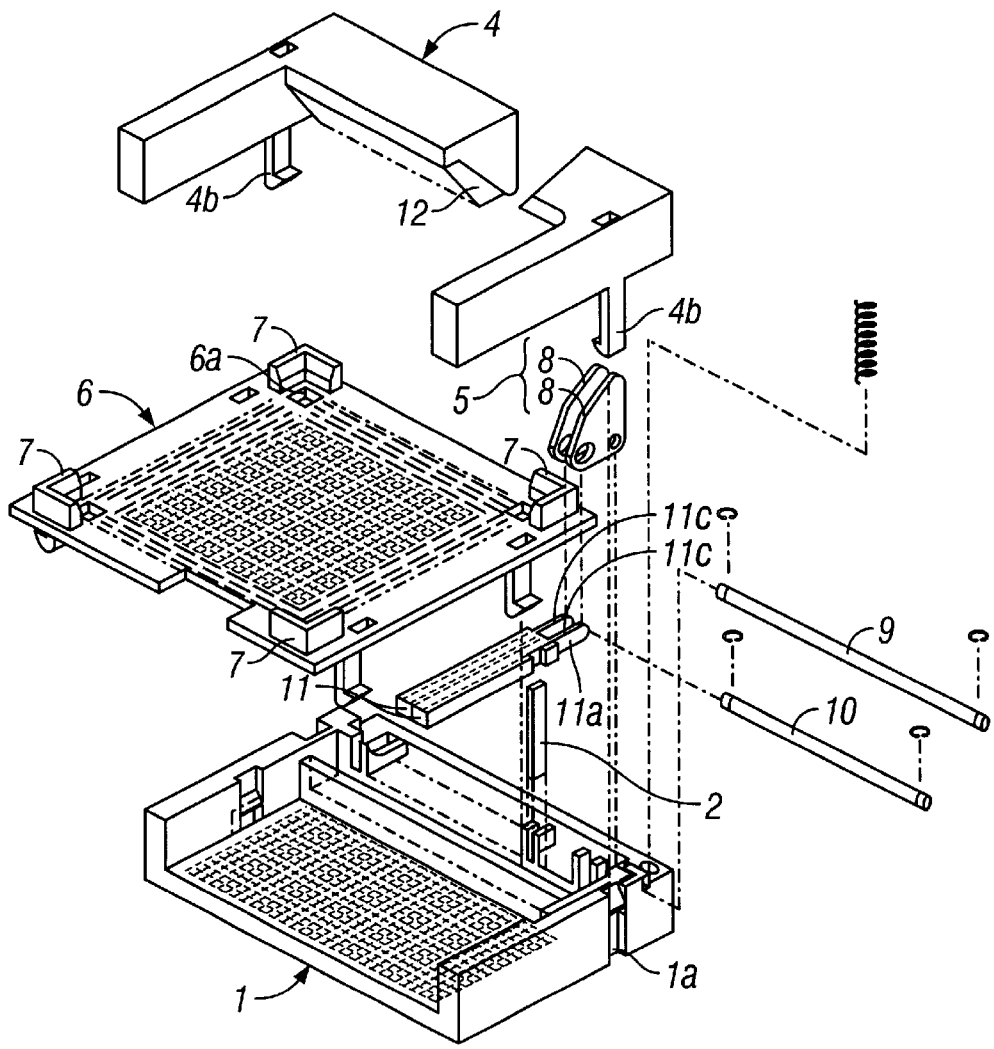
FIG. 2 is a partially sectional disassembled perspective view of the socket shown in FIG. 1.
Figure 3:
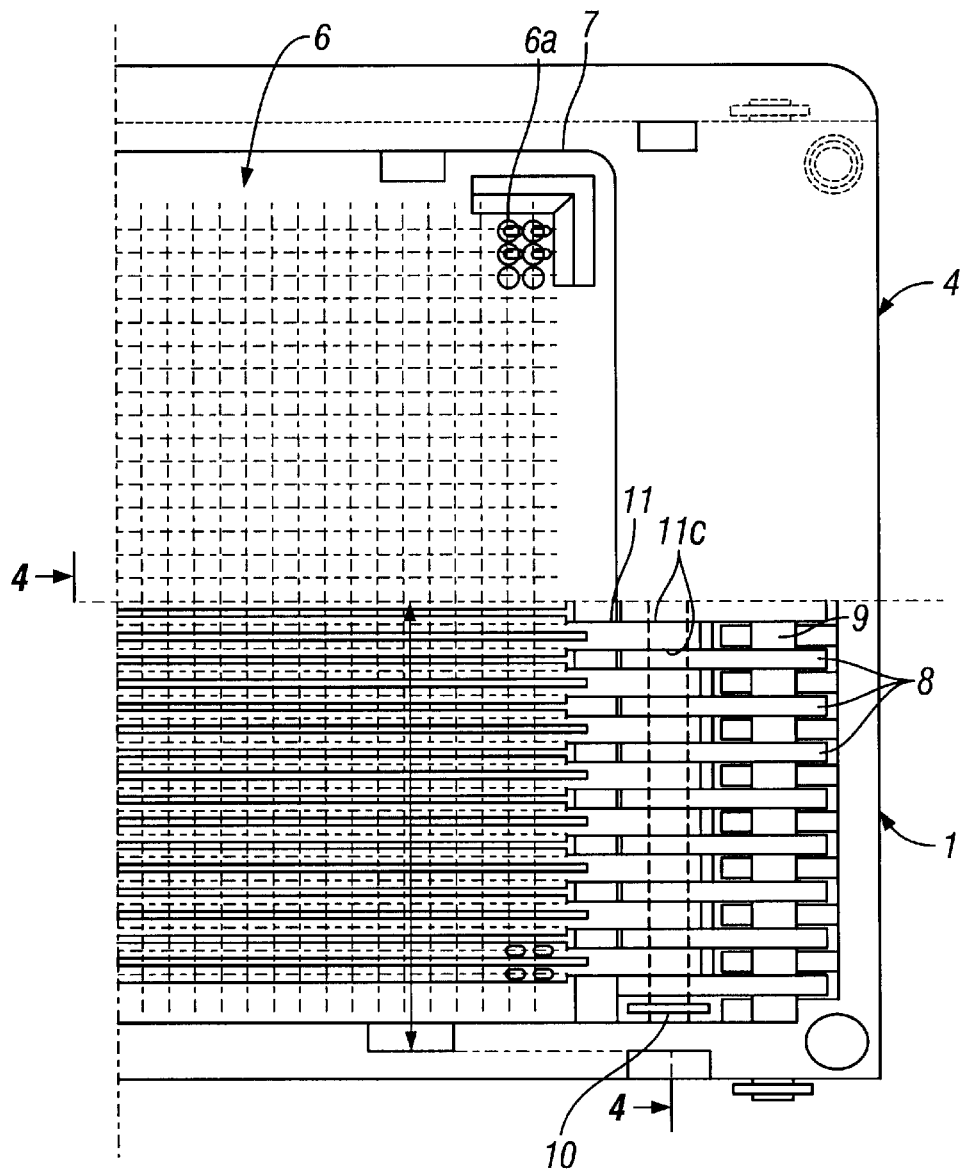
FIG. 3 is a partially sectional plan view of the socket shown in FIG. 1.

Below, an explanation will be made of embodiments of the present invention referring to the drawings.

FIG. 1 to FIG. 6 show a first embodiment of a case where the present invention is applied to a socket for an IC package. First, referring to FIG. 1 to FIG. 3, the socket has a base member 1 on which a large number of contact pins 2 for contact with a large number of pin-shaped or spherical-shaped terminals (not illustrated) arranged on the bottom surface of the IC package in the form of a matrix are arranged in the form of a matrix, a moving plate 3 provided so that it can laterally move with respect to the base member 1, an operation member 4 provided so that it can vertically move with respect to the base member 1, and an actuation member 5 for laterally moving the moving plate 3 in accordance with the depression of the operation member 4. The operation member 4 has a rectangular frame portion 4a open vertically inside so as to be able to vertically pass an IC package therethrough and a plurality of (for example, tour) leg portions 4b extending downward from the frame portion 4a. Holding grooves la for holding the leg portions 4b of the operation member 4 so that vertical movement is possible are formed in the two side surfaces of the base member 1.

Figure 4:
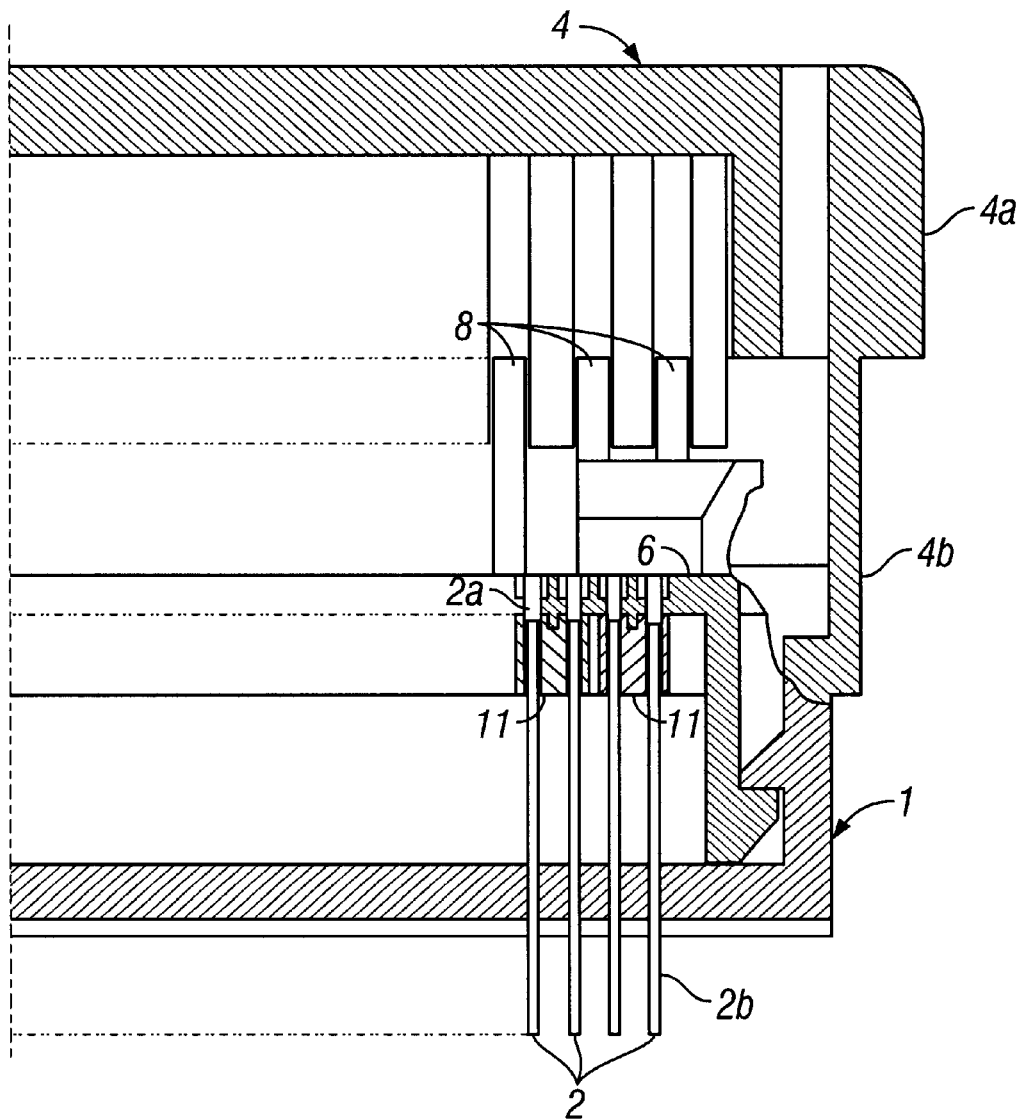
FIG. 4 is a vertically sectional view taken along a line 4—4 in FIG. 3 of the socket shown in FIG. 1.
Figure 5A:
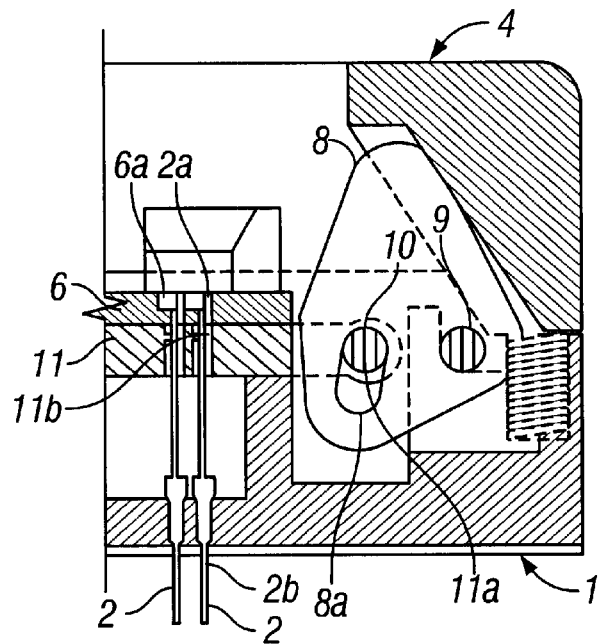
FIG. 5A and FIG. 5B are vertical sectional views of principal parts at one end portion of the moving plate showing the operation of the socket shown in FIG. 1.

As shown in FIG. 4 and FIG. 5A, the contact pins 2 are press-fit into the base member 1 and held at the base member 1. The upper end portions of the contact pins 2 form the contact portions 2a for contact with the terminals of the IC package. Further, the lower end portions of the contact pins 2 project downward from the bottom surface of the base member 1 and form external terminals 2b. As will be understood from FIG. 1 to FIG. 6, a base lid 6 is attached to the upper surface of the base member 1. A large number of through holes 6a receiving terminals of the IC package and contact pins 2 are arranged in the form of a matrix in this base lid 6 corresponding to the matrix arrangement of the terminals of the IC package and contact pins 2. The IC package can be mounted from the top of the operation member 4 on the base lid 6 guided by a positioning piece 7 provided on the upper surface of the base lid 6.

Actuation members 5 are arranged almost horizontally symmetrically on one end portion (refer to FIG. 1 to FIG. 5A) and the other end portion (refer to FIG. 6) of the moving plate 3. Referring to FIG. 1 to FIG. 5A, the actuation member 5 at one end portion of the moving plate 3 is divided into at least three units, with each unit having a single actuation plate 8. The actuation plates 8 are pivotally attached to the base member 1 via a support shaft 9 arranged at one end portion of the base member 1 and, at the same time, arranged at intervals from each other along one end portion of the moving plate 3.

Similarly, the actuation member 5 at the other end portion of the moving plate 3 is divided into at least three units, with each unit having a single actuation plate 8. The actuation plates 8 are pivotally attached to the base member 1 via a support shaft 9 arranged at the other end portion of the base member 1 and, at the same time, arranged at intervals from each other along the other end portion of the moving plate 3 (refer to FIG. 6).

Figure 16:
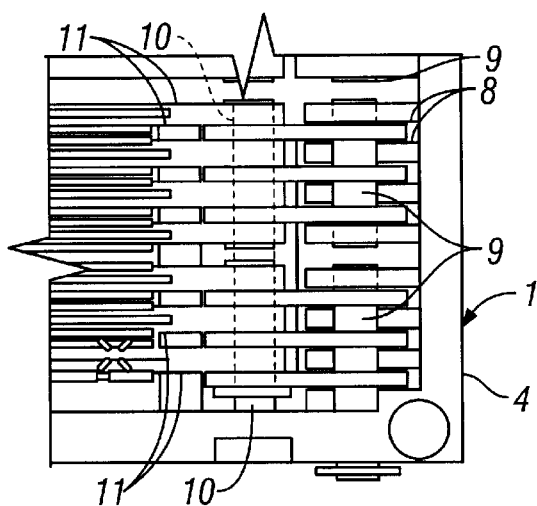
FIG. 16 is a plan view of principal parts showing a modification of the socket shown in FIG. 3.

The moving plate 3 is arranged between the two support shafts 9 and 9 to allow lateral movement. The moving plate 3 and the actuation plates 8 are connected and engaged via the transmission shafts 10 and 10 provided at the two ends thereof. AS shown in FIG. 16, the support shafts 9 and the transmission shafts 10 may each be divided into a plurality of sections in the direction orthogonal to the direction of lateral movement of the moving plate 3. In this embodiment, the moving plate 3 comprises a plurality of plate pieces 11 having attachment holes 11a and 11a through which the transmission shafts 10 and 10 pass at the two ends. Each plate piece 11 is formed with a row of through holes 11b through which the contact pins 2 pass. On the other hand, each actuation plate B is formed with a cam hole 8a engaging with a transmission shaft 10. Recessed portions 11c are formed in the two side surfaces of the two end portions of each plate piece 11. An actuation plate 8 can be inserted into the space formed by the recessed portions 11c and c of two plate pieces 11 and 11 adjoining each other. Accordingly, a maximum of one less the number of plate pieces 11 of actuation plates 8 can be alternately arranged along a transmission shaft 10. The number of the actuation plates 8 is preferably three or more so as to attain the initial object of the present invention, but it is not particularly necessary to arrange the actuation plates 8 in all spaces between adjoining plate pieces 11 and 11. Further, the actuation plates 8 of the embodiment can act independently from each other about the support shaft 9, but even if these plurality of actuation plates 8 are integrally formed, the initial object of the present invention is achieved. Even in this case, preferably a plurality of cam holes 8 engaging with the transmission shaft 10 are arranged in the integrally formed actuation plates.

Referring to FIG. 1, FIG. 2, FIG. 5A, and FIG. 5B, at one end portion of the operation member 4, provision is made of a pressing portion 12 for pressing the upper end portions of the actuation plates 8 in substantially the horizontal direction above the support shaft 9 at one end portion of the base member 1 at the time of depression of the operation member 4 and thereby pivoting the actuation plates 8 inward of the base member 1 (that is, the counterclockwise direction in FIG. 5A). Similarly, at the other end portion of the operation member 4, provision is made of a pressing portion 12 for pressing the upper end portion of the actuation plates 8 in substantially the horizontal direction above the support shaft 9 at the other end portion of the base member 1 at the time of depression of the operation member 4 and thereby pivoting the actuation plate 8 inward of the base member 1 (that is, the clockwise direction in FIG. 6). In this embodiment, the pressing portions 12 and 12 of the operation member 4 have inclined cam surfaces 12a. Ribs 12b for defining the intervals between each two adjoining actuation plates 8 and 8 are arranged on these cam surfaces 12a.

Figure 5B:
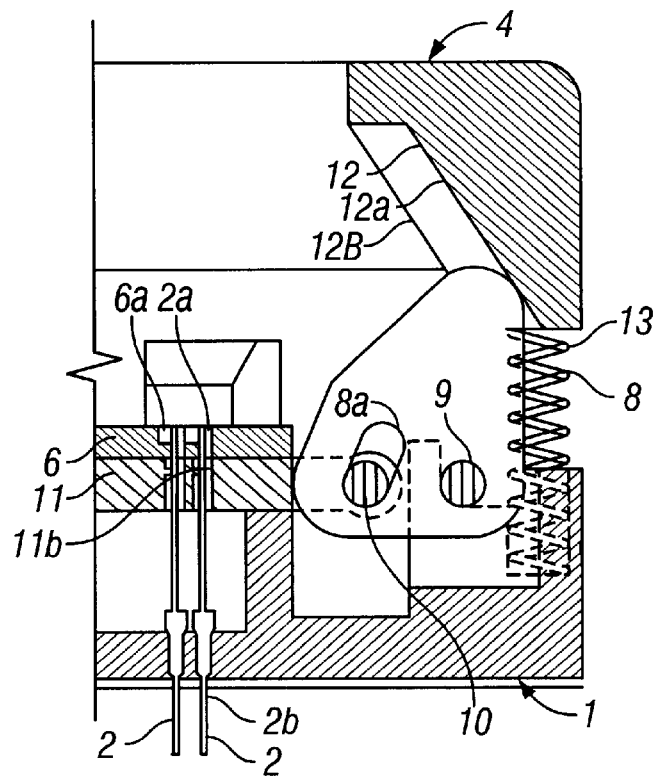
Figure 6:
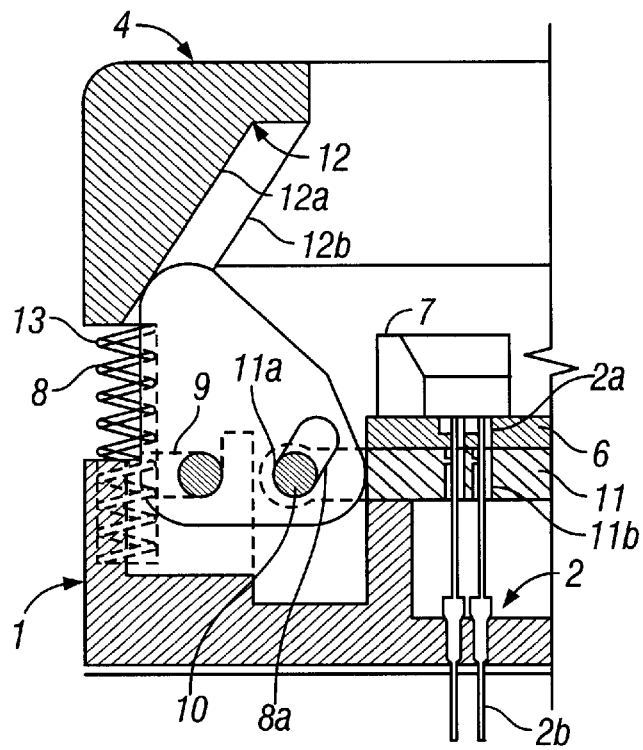
FIG. 6 is a vertical sectional view of principal parts at the other end portion of the moving plate showing the operation of the socket shown in FIG. 1.

As will be understood from FIG. 5A and FIG. 5B, cam holes 8a engaging with a transmission shaft 10 attached to one end portions of the plate pieces 11 are formed in the actuation plates 8 at one end portion of the base member 1. The cam holes 8a play the role of moving the transmission shaft 10 rightward from the position of FIG. 5A to the position of FIG. 5B with respect to the base member 1 at the time of pivoting of the actuation plates 8 due to the depression of the operation member 4. Similarly, cam holes 8a engaging with the transmission shaft 10 attached to the other end portions of the plate pieces 11 is formed in the actuation plates 8 at the other end portion of the base member 1. These cam holes 8a play the role of moving the transmission shaft 10 rightward from the position of FIG. 6 with respect to the base member 1 at the time of pivoting of the actuation plates 8 due to the depression of the operation member 4.

In a socket having the above configuration, when the operation member 4 is depressed from the position of FIG. 5A, as shown in FIG. 5B, the actuation plates 8 at one end portion of the base member 1 pivot in the counterclockwise direction in the figure and laterally move the plate piece 11 rightward in the figure via the transmission shaft 10, therefore the contact portions 2a of the contact pins 2 pass through the through holes 11b of the plate pieces 11 are pushed by the plate pieces 11, are pushed rightward in the figure from the contact position shown in FIG. 5A, and move up to the non-contact position shown in FIG. 5B. Accordingly, at the non-contact position shown in FIG. 6, the IC package can be inserted and removed with no load. On the other hand, when the depression force of the operation member 4 is released after mounting the IC package on the base lid 6, the contact pins 2 return to the contact position while moving the plate pieces 11 leftward in FIG. 5A by their restoration force. Note that a return spring 13 shown in FIG. 2 performs the role of returning the operation member 4 upward and preventing vertical looseness when the contact pins 2 contact the terminals of the IC package.

According to the above configuration, the actuation pressure by the depression force of the operation member 4 can be dispersed to at least three positions by the actuation plates 8 and made to act upon the plate pieces 11 forming the moving plate. Accordingly, the load applied to the individual actuation plates 8 can be reduced, therefore the deformation and wear of the actuation plates 8 can be suppressed to the lowest limit and the size of the actuation plates 8 can be made small. Accordingly, it is possible to reduce the size of the socket and reduce the manufacturing cost. Further, since the moving plate 3 is divided into a plurality of plate pieces 11 in which through holes 11a through which the transmission shafts 10 pass are formed at the end portions, sockets having different numbers of contact pins can be easily manufactured by changing the combination of the number of plate pieces 11. Note that a similar functional effect is obtained even in a socket in which the plurality of actuation plates 8 are integrally formed if the holes 8a serving as the engagement portions with the transmission shafts 10 are provided at proper positions.

Figure 7:
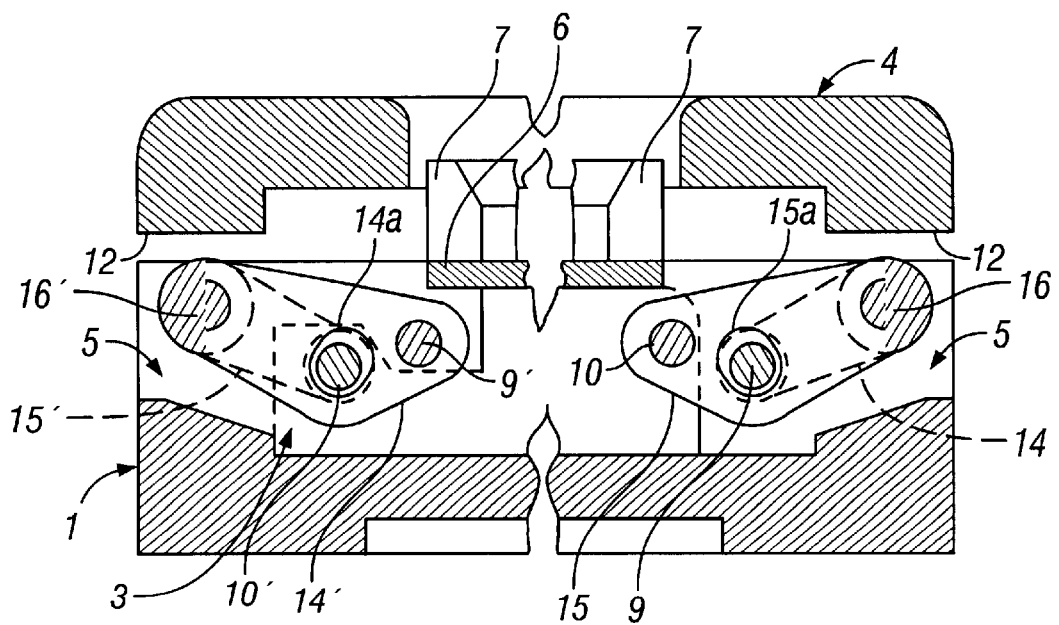
FIG. 7 is a partially broken schematic vertical sectional view of an electric device socket showing a second embodiment of the present invention.
Figure 8:
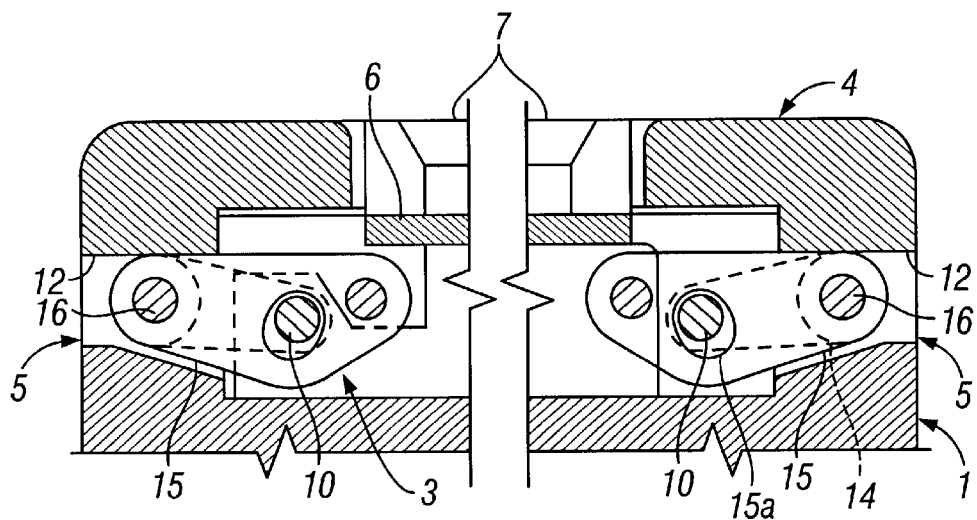
FIG. 8 is a partially broken schematic vertical sectional view showing the operation of the socket shown in FIG. 7.
Figure 9:
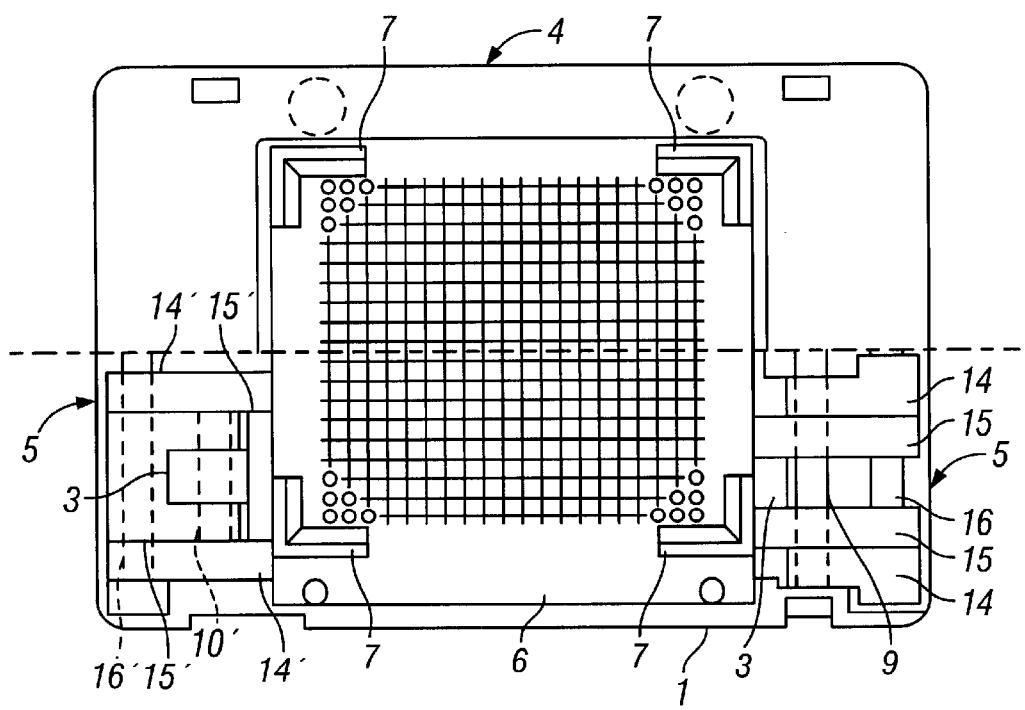
FIG. 9 is a schematic plan view perspectively showing one part of the operation member of the socket shown in FIG. 7.

FIG. 7 to FIG. 9 show a second embodiment of the present invention. Referring to these figures, in the socket of this second embodiment, each actuation member 5 is divided into a plurality of units in a direction orthogonal to the direction of lateral movement of the moving plate 3. Each unit is constituted by first and second actuation plates 14 and 15 constituting a toggle mechanism.

The actuation member 5 at one end portion (right end portion in FIG. 7) of the moving plate 3 is constituted so as to perform a pulling action with respect to the moving plate 3 in the direction of lateral movement thereof. Namely, on the right end portion in FIG. 7 of the moving plate 3, one end portion of the first actuation plate 14 is pivotally attached to the base member 1 via a support shaft 9, and one end portion of the second actuation plate 15 is connected and engaged with one end portion (right end portion) of the moving plate 3 via a transmission shaft 10 passing through one end portion of the moving plate 3. Then, the other end portion of the first actuation plate 14 and the other end portion of the second actuation plate 15 are pivotally connected to each other via a connection shaft 16. A through hole 15a through which the support shaft 9 passes is formed in the second actuation plate 15. This through hole 15a is formed so as to have a larger diameter than that of the support shaft 9 and in the form of a long hole so that the second actuation plate 15 does not interfere with the support shaft 9 during the actuation of the second actuation plate 15.

The other end portions of the two actuation plates 14 and 15 constitute a pressure receiving portion for receiving the actuation force from the pressing portion 12 of the operation member 4. Accordingly, in the actuation member 5 at the right end portion in FIG. 7, that is, the pulling side, when the pressure receiving portion is pressed downward by the pressing portion 12 of the operation member 4, the first actuation plate 14 pivots around the support shaft 9, therefore the connection shaft 16 moves downward in an arc around the support shaft 9. For this reason, the second actuation plate 15 pivots together with the connection shaft 16 around the transmission shaft 10, but at this time the connection shaft 16 pivots around the support shaft 9 provided on the base member 1, therefore, as shown in FIG. 8, the transmission shaft 10 will be pulled rightward in FIG. 7 together with the moving plate 3 with respect to the base member 1.

On the other hand, the actuation member 5 at the other end portion (left end portion in FIG. 7) of the moving plate 3 is constituted so as to perform a pressing action with respect to the moving plate 3 in the direction of lateral movement thereof. Namely, a support shaft 9' of the moving plate 7 at the left end portion in FIG. 7 is located at a position exhibiting horizontal symmetry with the transmission shaft 10 on the pulling side. A transmission shaft 10' is arranged at a position exhibiting horizontal symmetry with the support shaft 9 at the pulling side. Then, a first actuation plate 14' with one end portion which is pivotally attached to the base member 1 via the support shaft 9' is arranged in horizontal symmetry with the second actuation plate 15 at the pulling side, while a second actuation plate 15' with one end portion which is connected and engaged with the left end portion of the moving plate 3 via the transmission shaft 10' is arranged in horizontal symmetry with the first actuation plate 14 at the pulling side. Further, in the first actuation plate 14', a through hole 14', a through which the support shaft 10' passes is arranged in horizontal symmetry with a through hole 15a of the second actuation plate 15 at the pulling side. The other end portions of the two actuation plates 14' and 15' constitute the pressure receiving portion receiving the actuation force from the pressing portion 12 of the operation member 4.

Accordingly, in the actuation member 5 at the left end portion in FIG. 7, that is, the pressing side, when the pressure receiving portion is pressed downward by the pressing portion 12 of the operation member 4, the first actuation plate 14' pivots around the support shaft 9', therefore the connection shaft 16' moves downward in an arc around the support shaft 9'. For this reason, the second actuation plate 15' pivots together with the connection shaft 16' around the transmission shaft 10', but at this time the connection shaft 16' pivots around the support shaft 9' provided at the base member 1, therefore, as shown in FIG. 8, the transmission shaft 10' will be pressed rightward in FIG. 7 together with the moving plate 3 with respect to the base member 1.

Note that the moving plate 3 of this second embodiment comprises a single plate unlike in the first embodiment. FIG. 9 is a schematic plan view perspectively showing half of the operation member 4 from the center line in the direction of lateral movement of the moving plate 3, but as easily understood from the figure, the actuation member 5 at the pulling side (right end portion in FIG. 7) has four second actuation plates 15 connected and engaged with one end portion of the moving plate 3, while the actuation member 5 of the pressing side (left end portion in FIG. 7) has four second actuation plates 15' connected and engaged with the other end portion of the moving plate 3, but the second actuation plate 15' on the pressing side (left end portion in FIG. 7) is obtained by integrally joining two plates.

Figure 10:
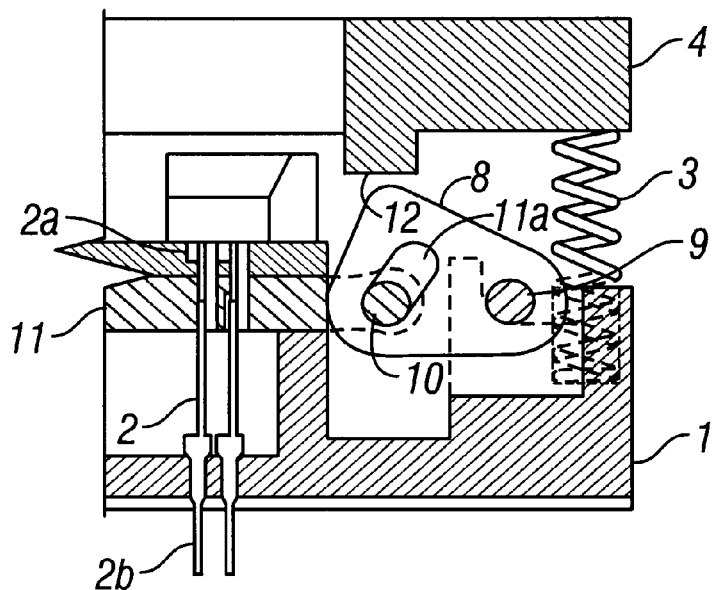
FIG. 10 is a vertical sectional view of principal parts of an electric device socket showing a third embodiment of the present invention.

FIG. 10 shows a third embodiment of the present invention. The actuation member 5 of this third embodiment has a plurality of (preferably three or more) actuation plates 8 resembling those of the first embodiment, but is different from the first embodiment in the point that each actuation plate 8 is depressed downward by the pressing portion 12 of the operation member 4 above the transmission shaft 10 at the time of depression of the operation member 4. The rest of the configuration is similar to that of the first embodiment. In this embodiment as well, a plurality of (preferably three or more) actuation plates 8 are arranged at intervals from each other along the longitudinal direction of the support shaft 9 and transmission shaft 10, therefore the actuation force due to the depression force of the operation member 4 can be dispersed to a plurality of positions by the actuation plates 8 and made to act upon the moving plate 3. Accordingly, the load applied to the individual actuation plates 8 can be reduced, therefore deformation and wear of the actuation plates 8 can be suppressed to the lowest limit and the size of the actuation plates 8 can be made smaller.

Figure 11:
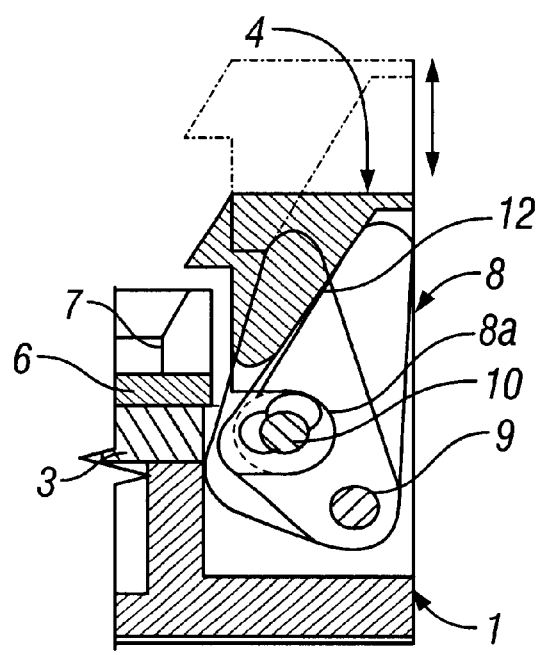
FIG. 11 is a vertical sectional view of principal parts of an electric device socket showing a fourth embodiment of the present invention.

FIG. 11 shows a fourth embodiment of the present invention. This fourth embodiment is different from the first embodiment in the point that each actuation plate 8 is pressed outward of the base member 1 by the pressing portion 12 of the operation member 4 at the time of depression of the operation member 4. Each actuation plate 8 pivots in the clockwise direction in the figure by this and laterally moves the moving plate 3 rightward in the figure. In this embodiment as well, a plurality of (preferably three or more) actuation plates 8 are arranged at intervals from each other along the longitudinal direction of the support shaft 9 and the transmission shaft 10, therefore the actuation pressure due to the depression force of the operation member 4 can be dispersed to a plurality of positions by the actuation plates 8 when made to act upon the moving plate 3. Accordingly, the load applied to the individual actuation plates 8 can be reduced, therefore the deformation and wear of the actuation plates 8 can be suppressed to the lowest limit and the size of the actuation plates 8 can be made smaller.

Figure 12:
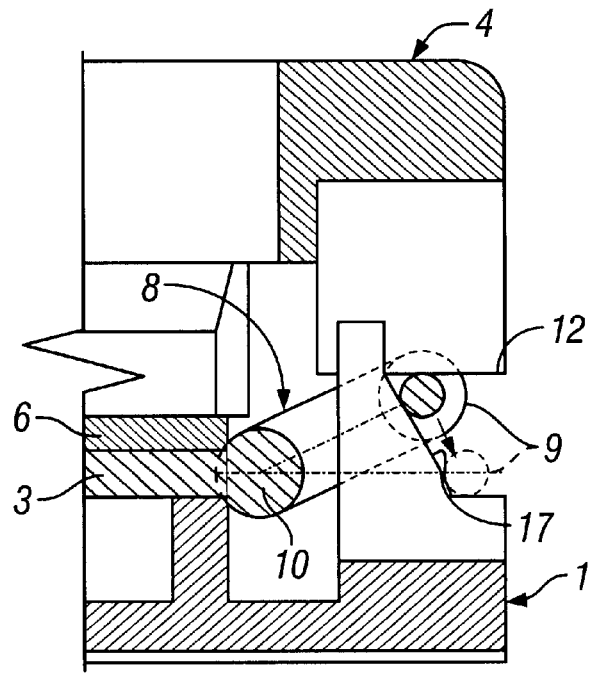
FIG. 12 is a vertical sectional view of principal parts of an electric device socket showing a fifth embodiment of the present invention.

FIG. 12 shows a fifth embodiment of the present invention. In this fifth embodiment, one end portion of each actuation plate 8 is pivotally attached to the moving plate 3 via a transmission shaft 10 extending passing through one end portion of the moving plate 3, a guide portion 17 for guiding and supporting the support shaft 9 extending connecting the other end portions of the actuation plates 8 so as to laterally move the support shaft 9 according to the downward movement thereof is provided in the base member 1, and the operation member 4 is provided with a pressing portion 12 for pressing the support shaft 9 downward at the time of depression thereof. In this embodiment, when the support shaft 9 is depressed by the operation member 4, as indicated by the imaginary line in the figure, the support shaft 9 moves in the horizontal direction while moving downward along the guide portion 17 of the base member 1, therefore the actuation plate 8 pulls the moving plate 3 rightward in the figure via the transmission shaft 10 while pivoting around the transmission shaft 10 and laterally moves the moving plate 3. In this embodiment as well, a plurality of (preferably three or more) actuation plates 8 are arranged at intervals from each other along the longitudinal direction of the support shaft 9 and the transmission shaft 10, therefore the actuation pressure due to the depression force of the operation member 4 can be dispersed to a plurality of positions by the actuation plates 8 when made to act upon the moving plate 3. Accordingly, the load applied to the individual actuation plates 8 can be reduced, therefore the deformation and wear of the actuation plate 8 can be suppressed to the lowest limit and the size of the actuation plates 8 can be made smaller.

Figure 13:
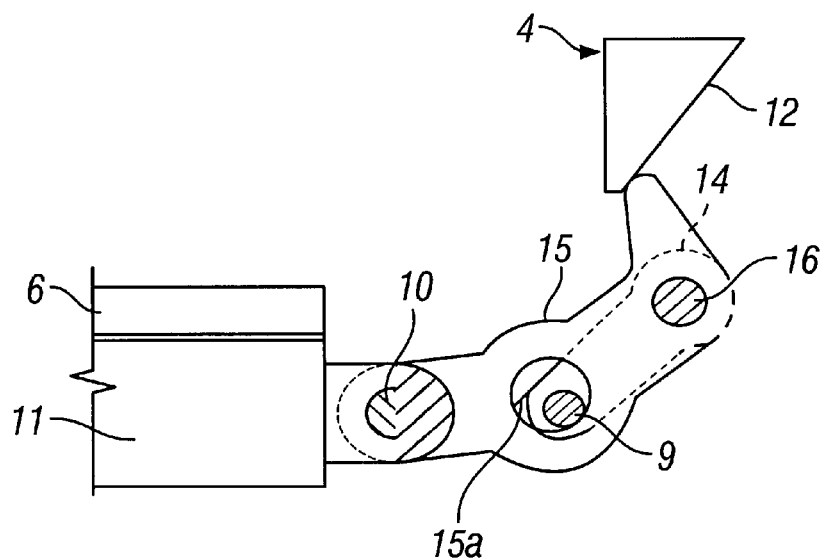
FIG. 13 is a vertical sectional view of principal parts of an electric device socket showing a sixth embodiment of the present invention.
Figure 14:
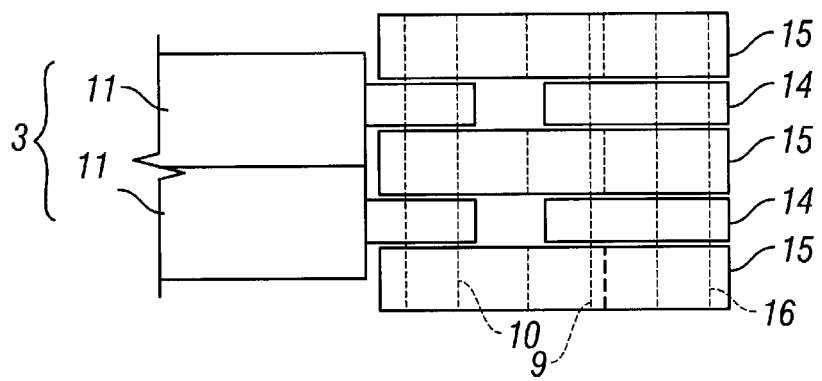
FIG. 14 is a plan view of principal parts of the socket shown in FIG. 13.
Figure 15:
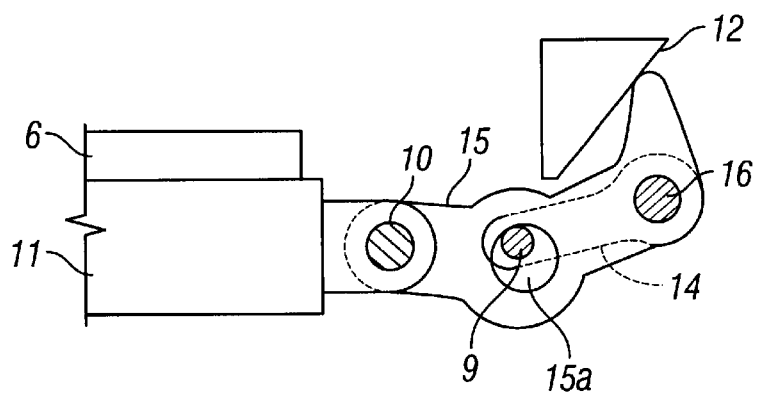
FIG. 15 is a vertical sectional view of principal parts showing the operation of the socket shown in FIG. 13.

FIG. 13 to FIG. 15 show a sixth embodiment of the present invention. In this sixth embodiment, the actuation member 5 provided at the end portion on the pulling side of the moving plate 3 is divided into a plurality of units in a direction orthogonal to the direction of lateral movement of the moving plate 3. Each unit has a first actuation plate 14 with one end portion which is pivotally attached to the base member 1 via the support shaft 9 arranged at one end portion of the base member 1 and has a second actuation plate 15 with one end portion which is pivotally attached to the moving plate 3 via the transmission shaft 10 extending passing through one end portion of the moving plate 3. The other end portions of the first and second actuation plates 14 and 15 are pivotally connected to each other via the connection shaft 16. A through hole 15a through which the support shaft 9 passes is formed in the second actuation plate 15. Further, the operation member 4 is provided with a pressing portion 12 for pressing the other end portion of the second actuation plate 15 at the time of depression thereof.

The actuation member 5 of this sixth embodiment has a toggle mechanism resembling that of the actuation member 5 at the pulling side of the second embodiment. When the other end portion of the second actuation plate 15 is pressed by the pressing portion 12 of the operation member 4, the second actuation plate 15 pivots around the transmission shaft 10, but at this time the first actuation plate 14 pivots around the support shaft 9, therefore the connection shaft 16 moves in an arc around the support shaft 9. In this embodiment as well, the actuation member 5 comprises a plurality of (preferably three or more) units each comprising a first actuation plate 14 and a second actuation plate 15, therefore the actuation pressure due to the depression force of the operation member 4 can be dispersed to a plurality of positions by the actuation member 5 when made to act upon the moving plate 3. Accordingly, the load applied to the individual actuation plates 14 and 15 can be reduced, therefore the deformation and wear of the actuation plates 14 and 15 can be suppressed to the lowest limit and the size of the actuation plates can be made smaller.

Note that although three second actuation plates 15 are shown in FIG. 14, it is also possible to provide a plurality of second actuation plates 15 independently and pivotably with respect to the connection shaft 16, but it is also possible to affix all of the second actuation plates 15 to the connection shaft 16 so that pivoting is impossible. In this case, the plurality of second actuation plates 15 will actuate as one assembly.

In the other embodiments as well, similarly the actuation plates 8 or second actuation plates 15 can be integrally joined in a direction orthogonal to the direction of lateral movement of the moving plate 3, but even if the actuation plates 8 or second actuation plates 15 are integrally joined, the actuation plates 8 or second actuation plates 15 and the end portion of the moving plate 3 can be engaged at a plurality of positions (preferably three or more) by effectively utilizing the lateral width of the end portion of the moving plate 3 and the thickness of the actuation plates 8 or second actuation plates 15 can be sufficiently secured, therefore the lateral movement force made to act upon the end portion of the moving plate 3 can be effectively dispersed and, at the same time, the stability of actuation can be improved.

The moving plate 3 in the third to sixth embodiments is divided into a plurality of plate pieces 11 each provided with a row of through holes 11b similar to the first embodiment, but it is also possible to divide the moving plate 3 into a plurality of plate pieces 11 each provided with a plurality of rows of through holes 11b and possible to use one moving plate 3 as in the related art.

Further, in the actuation plates 8 or first and second actuation plates 14 and 15 in the present invention, in the first embodiment, the operation member 4 is vertically moveably supported with respect to the base member 1 via the leg portions 4b, but it is also possible to slidably engage the operation member 4 with the arc portions of the actuation plates 8 on the periphery of the support shaft 9 and hold this at the actuation plates 8.

Further, it is preferred in view of the balance of weight and operation that the actuation plates 8 etc. be arranged at the two end portions of the moving plate 3 in substantial horizontal symmetry, but even if the actuation plates are arranged on only one end portion of the moving plate 3 as in the sixth embodiment, the initial object of the present invention can be achieved.

Furthermore, the present invention can also be applied to electric devices other than IC packages.

As clear from the above explanation, according to the present invention, actuation members for laterally moving the moving plate according to the depression of the operation member are arranged in a direction orthogonal to the direction of lateral movement of the moving plate along the end surface of the moving plate, therefore the actuation force for the lateral movement of the moving plate can be effectively dispersed and made to act upon the end portion of the moving plate. Accordingly, an electric device socket capable of stably operating the moving plate and the actuation member for laterally moving the moving plate and in addition excellent in operability can be provided.

What is claimed is:

1. A socket for an electric device comprising:
    a base member having an upper surface and a plurality of contact pins for contact with terminals of an electric device which protrude upwardly from the upper surface;
    a moving plate for receiving the electric device which engages with the contact pins and which is laterally movable along the upper surface of the base member so that the terminals of the electric device are positioned to contact the contact pins when the moving plate is laterally moved in one direction and are positioned not to contact the contact pins when the moving plate is laterally moved in an opposite direction, the moving plate having one end portion and an opposite end portion in the direction of lateral movement thereof;
    an operation member provided on the base member and vertically movable in a direction orthogonal to the upper surface of the base member;
    a support shaft, extending in a direction orthogonal to the direction of lateral movement of the moving member and the direction of the vertical movement of the operation member; and
    an actuation member engaged with the one end portion of the moving plate and supported movably by the base member via said support shaft so as to be moved by the operation member when the operation member is moved vertically toward the base member and to laterally move the moving plate in the opposite direction.

2. The socket according to claim 1, wherein the actuation member is engaged with the end portion of the moving plate via a transmission shaft passing through the one end portion of the moving plate in a direction parallel to the support shaft.

3. The socket according to claim 1, wherein the transmission shaft is divided into a plurality of sections in a direction parallel to the support shaft.

4. The socket according to claim 1, wherein an opposite actuation member is engaged with the opposite end portion of the moving plate and supported movably by the base member via an opposite support shaft extending in a direction parallel to the support member so as to be moved by the operation member when the operation member is moved vertically toward the base member and to laterally move the moving plate in the opposite direction.

5. The socket according to claim 1, wherein the actuation member comprises a single actuation plate, and the actuation plate has three or more engagement portions engaged with the one end portion of the moving plate.

6. The socket according to claim 1, wherein the actuation member has a plurality of actuation plates which are connected to each other and constitute a toggle mechanism.

7. The socket according to claim 1, wherein the actuation member comprises three or more independent units which can be individually moved by the operation member so as to laterally move the moving plate in the opposite direction when the operation member is moved vertically toward the base member.

8. The socket according to claim 7, wherein each unit comprises a single actuation plate.

9. The socket according to claim 7, wherein each unit has a plurality of actuation plates which are connected to each other and constitute a toggle mechanism.

10. The socket according to claim 1, wherein the moving plate comprises a plurality of plate pieces which are separated from each other in a direction parallel to the support shaft and have the same length in a direction of lateral movement thereof.

11. The electric device socket according to claim 1, wherein the electric device is an IC package.

* * * * *